US006414514B1

(12) United States Patent
Heile

(10) Patent No.: US 6,414,514 B1
(45) Date of Patent: Jul. 2, 2002

(54) LOGIC DEVICE ARCHITECTURE AND METHOD OF OPERATION

(75) Inventor: Francis B. Heile, Santa Clara, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/618,317

(22) Filed: Jul. 18, 2000

Related U.S. Application Data

(62) Division of application No. 09/003,415, filed on Jan. 5, 1998, which is a continuation of application No. 08/838,398, filed on Apr. 3, 1997.

(60) Provisional application No. 60/015,122, filed on Apr. 10, 1996, and provisional application No. 60/014,942, filed on Apr. 5, 1996.

(51) Int. Cl.[7] ............................................ H03K 19/177

(52) U.S. Cl. ........................................... 326/41; 326/39

(58) Field of Search .............................. 326/37–41, 47, 326/101

(56) References Cited

U.S. PATENT DOCUMENTS 3,473,160 A 10/1969 Wahlstrom ............... 340/175.5
4,020,469 A 4/1977 Manning .................... 340/172
4,124,899 A 11/1978 Birkner ...................... 364/716
4,417,245 A 11/1983 Melas et al. ............. 340/825.8
4,609,986 A 9/1986 Hartmann et al. .......... 364/200
4,617,479 A 10/1986 Hartmann et al. .......... 307/465
4,642,487 A 2/1987 Carter ........................ 307/465
4,677,318 A 6/1987 Veenstra et al. ............ 307/465
4,706,216 A 11/1987 Carter ......................... 365/94
4,713,792 A 12/1987 Hartmann et al. .......... 364/900
4,717,912 A 1/1988 Harvey .................... 340/825.8
4,823,278 A 4/1989 Kikuchi et al. ............. 364/491
4,864,161 A 9/1989 Norman et al. .......... 307/272.2
4,870,302 A 9/1989 Freeman ..................... 307/465
4,871,930 A 10/1989 Wong et al. ................ 307/465

(List continued on next page.)

FOREIGN PATENT DOCUMENTS

GB 1 444 084 7/1976 .......... H03K/19/00
GB 2 180 382 A 3/1987 .......... H03K/19/00

OTHER PUBLICATIONS

Minnick, "Survey of Microcellular Research," Journal of ACM (Apr. 1967).
Nichols, "A Logical Next Step For Read–Only Memories, " Electronics (Jun. 1967).
Wahlstrom, "Programmable Logic Arrays—Cheaper By The Millions," Electronics (Dec. 1967).
Shoup, "Programmable Cellular Logic Arrays," Carnegie Mellon Ph.D. Thesis (Mar. 1970).
Fleisher, "The Writeable Personalized Chip," Computer Design (Jun. 1970).
Mukhopadhyay, "Recent Developments In Switching Theory," Academic Press, pp. 1–436 (1971).
Benes V.E., "Mathematical Theory of Connecting Networks and Telephone Traffic, " Chapter 3: Rearrangeable Networks, Academic Press, Inc., pp. 82–135 (1965).

(List continued on next page.)

*Primary Examiner*—Michael Tokar
*Assistant Examiner*—James H Cho
(74) *Attorney, Agent, or Firm*—Townsend and Townsend and Crew LLP

(57) ABSTRACT

A progammable integrated circuit with a logic element including an input, an output and a logic function block wherein an input signal may be either passed form the input to the output bypassing the logic function block or the input signal may pass through the logic function block to provide a result to the output. Thus, a signal on the input may pass through the logic element without being logically altered or stored.

25 Claims, 9 Drawing Sheets

205 303 3XN LAB INPUT LINES 301 N LOCAL LINES 301a 305 LUT & DFF 240 309 352 307a 307b 307c 313 315 311a 311b 311c

U.S. PATENT DOCUMENTS

| | | | | | |
|---|---|---|---|---|---|
| 4,899,067 | A | | 2/1990 | So et al. | 307/465 |
| 4,912,342 | A | | 3/1990 | Wong et al. | 307/465 |
| 5,036,473 | A | | 7/1991 | Butts | 364/489 |
| 5,109,353 | A | | 4/1992 | Sample et al. | 364/578 |
| 5,121,006 | A | | 6/1992 | Pedersen et al. | 307/465 |
| 5,155,858 | A | | 10/1992 | DeBruler et al. | 395/800 |
| 5,179,551 | A | | 1/1993 | Turner | 370/60 |
| RE34,363 | E | | 8/1993 | Freeman | 307/465 |
| 5,241,224 | A | | 8/1993 | Pedersen et al. | 307/465 |
| B14,617,479 | A | | 9/1993 | Hartmann et al. | 307/465 |
| 5,258,668 | A | | 11/1993 | Cliff et al. | 307/465 |
| 5,260,610 | A | | 11/1993 | Pedersen et al. | 307/465 |
| 5,260,611 | A | * | 11/1993 | Cliff et al. | 326/39 |
| 5,274,581 | A | | 12/1993 | Cliff et al. | 364/784 |
| 5,276,425 | A | | 1/1994 | Swanson et al. | 340/826 |
| 5,329,470 | A | | 7/1994 | Sample et al. | 364/578 |
| 5,336,950 | A | | 8/1994 | Popli et al. | 307/465 |
| 5,341,044 | A | * | 8/1994 | Ahanin et al. | 326/41 |
| 5,350,954 | A | | 9/1994 | Patel et al. | 307/465 |
| 5,352,123 | A | | 10/1994 | Sample et al. | 439/61 |
| 5,359,242 | A | | 10/1994 | Veenstra | 307/465 |
| 5,436,575 | A | | 7/1995 | Pedersen et al. | 326/40 |
| 5,448,496 | A | | 9/1995 | Butts et al. | 364/489 |
| 5,452,231 | A | | 9/1995 | Butts et al. | 364/489 |
| 5,452,239 | A | | 9/1995 | Dai et al. | 364/578 |
| 5,455,525 | A | | 10/1995 | Ho et al. | 326/41 |
| 5,477,475 | A | | 12/1995 | Sample et al. | 364/578 |
| 5,495,476 | A | | 2/1996 | Kumar | 370/54 |
| 5,546,018 | A | * | 8/1996 | New et al. | 326/38 |
| 5,574,388 | A | | 11/1996 | Barbier et al. | 326/41 |
| 5,598,318 | A | | 1/1997 | DeWitt et al. | 361/683 |
| 5,612,891 | A | | 3/1997 | Butts et al. | 364/489 |
| 5,644,515 | A | | 7/1997 | Sample et al. | 364/578 |
| 5,657,241 | A | | 8/1997 | Butts et al. | 364/489 |
| 5,661,662 | A | | 8/1997 | Butts et al. | 364/489 |
| 5,689,195 | A | * | 11/1997 | Cliff et al. | 326/41 |
| 5,828,229 | A | | 10/1998 | Cliff et al. | 326/40 |

OTHER PUBLICATIONS

Heutink, “Implications Of Busing For Cellular Arrays,” Computer Design (Nov. 1974).

AT&T Microelec. Advance Data Sheet, “Optimized Reconfigurable Cell Array (ORCA) Series Field–Programmable Gate Arrays,” (Feb. 1993).

“FLEX 8000,” Altera Data Book, Chapter 3, 1995, pp. 35–115.

“MAX 9000,” Altera Data Book, Chapter 4, 1995, pp. 117–152.

“MAX 7000,”Altera Data Book, Chapter 5, 1995, pp. 153–215.

* cited by examiner

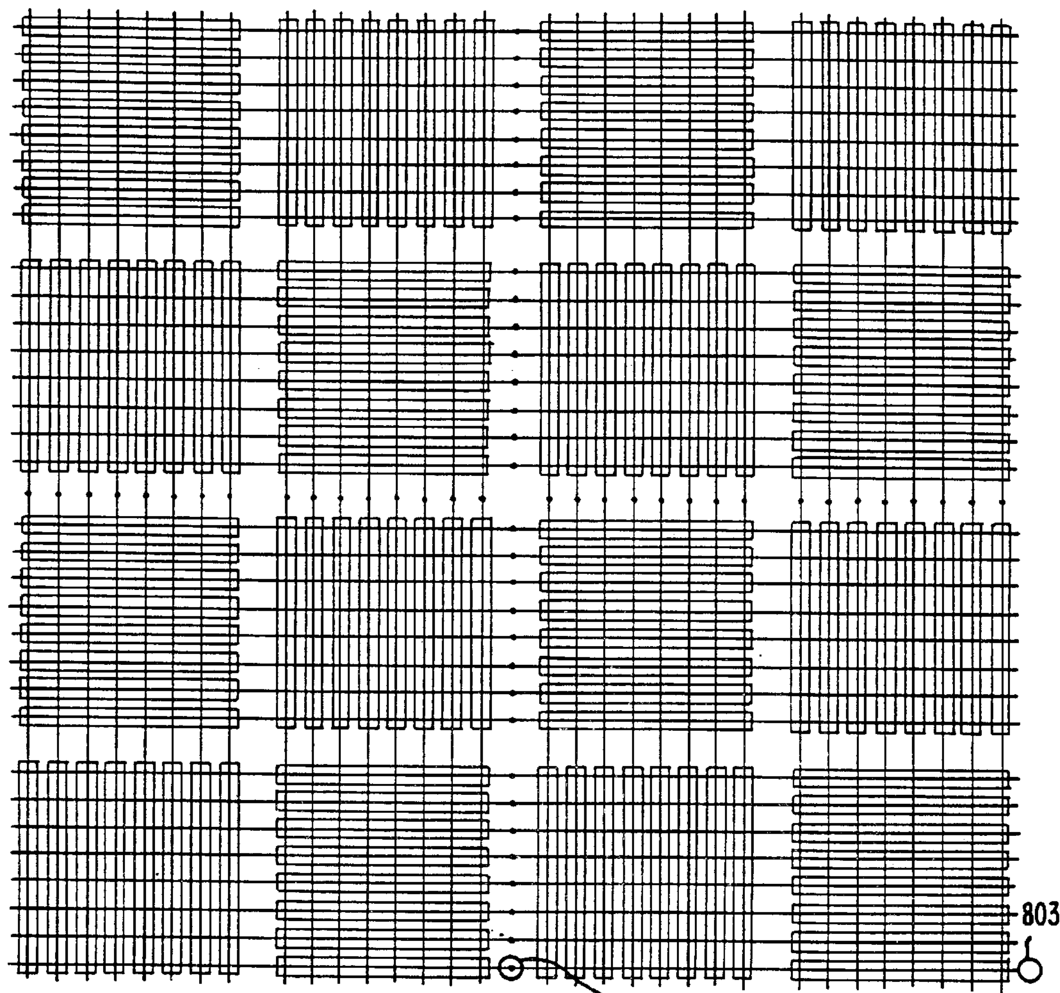
FIG. 8A.
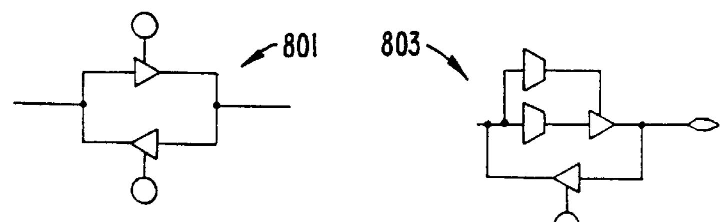
FIG. 8B.
FIG. 8C.

LOGIC DEVICE ARCHITECTURE AND METHOD OF OPERATION

CROSS-REFERENCE TO RELATED APPLICATIONS

This is a division of U.S. application Ser. No. 09/003,415, filed Jan. 5, 1998, which is a continuation of non-provisional U.S. patent application Ser. No. 08/838,398 filed Apr. 3, 1997, entitled PROGRAMMABLE LOGIC DEVICE WITH HIGHLY ROUTABLE INTERCONNECT, which claims the benefit of U.S. Provisional Patent Application Serial No. 60/015,122, filed Apr. 10, 1996 entitled LOGIC DEVICE ARCHITECTURE AND METHOD OF OPERATION, and Provisional Patent Application Serial No. 60/014,942, filed Apr. 5, 1996 entitled PROGRAMMABLE LOGIC DEVICE WITH HIGHLY ROUTABLE INTERCONNECT, all of which are incorporated herein by reference for all purposes.

BACKGROUND OF THE INVENTION

The present invention relates generally to the field of integrated circuits and their operation. More specifically, in one embodiment, the invention provides an improved logic device and method of its operation.

Logic devices and their methods of operation are well known to those of skill in the art. In particular, programmable logic devices have found wide application as a result of their combined low up-front cost and versatility to the user.

Altera's FLEX® and MAX® lines of programmable logic devices are among the most advanced and successful programmable logic devices in the industry. In the FLEX logic devices, a large matrix of logic elements is utilized. In a current commercial embodiment of such devices, each logic element includes a 4-input look-up table for performance of combinational logic and a register that provides for synchronous logic operation.

The logic elements are arranged in groups of, for example, eight logic elements to form larger logic array blocks (LABs). The LABs contain, among other things, a local interconnection structure. The local interconnections allow the outputs of the logic elements to be efficiently routed to other logic elements within a LAB. The various LABs are arranged on the device in a two dimensional array. The various LABs may be connected to each other and to pins of the device though continuous lines that run the entire length and width of the device.

The FLEX logic devices have met with substantial success and are considered pioneering in the area of programmable logic. While pioneering in the industry, certain limitations still remain. For example, it would be desirable to further increase the flexibility of the user and CAD software to program the device. In the presently available configurations, a particular signal may be blocked. That is, the signal cannot be routed out of a logic element or LAB because a path is not available. It is desirable to create a configuration in which blocked signals are minimized.

From the above, it is apparent that an improved logic device and method of its operation is desirable.

SUMMARY OF THE INVENTION

An improved logic device and method of operation is provided by virtue of the present invention. An aspect of the invention provides an improved logic element. The improved logic element performs routing functions as well as logic functions. Input signals of a logic element may be routed to one or more outputs of the logic element directly or after being operated upon by a logic function block.

In another aspect of the invention, additional routing flexibility is provided in a programmable logic device. The logic elements of a programmable logic device are arranged to form a Clos network. Although described herein with reference to columns and rows, it will be recognized that no horizontal or vertical meaning is intended. That is, the rows and columns may each be horizontally, vertically, or otherwise arranged. Any reference to rows and columns is intended only for ease of explanation of the preferred embodiment.

A plurality of logic elements are formed in rows and columns. Each column is fed by a set of column input signals, and each row provides a set of row output signals. Each of the logic elements in a row provide output signals that are combined to form a set of row output signals. Therefore, a grid with m rows and m columns, having logic elements with n outputs will have m sets of (m*n) outputs. Each column is provided with (m*n) inputs.

More than one plurality of logic elements of the arranged as described above may be combined with the row outputs of one being the column inputs to another. The plurality of logic elements may be oriented at about 90 degrees from each other providing for ease of routing. Three of more groups of logic elements combined in this manner form a Clos network. A Clos network ensures that a non-blocking path is available for each one-to-one mapping for the signals in the network.

A further understanding of the nature and advantages of the inventions herein may be realized by reference to the remaining portions of the specification and the attached drawings.

BRIEF DESCRIPTION OF THE DRAWINGS

FIGS. 8*a*, 8*b*, and 8*c* illustrate a 1024 logic cell device.

DESCRIPTION OF THE SPECIFIC EMBODIMENTS

Figure 1:
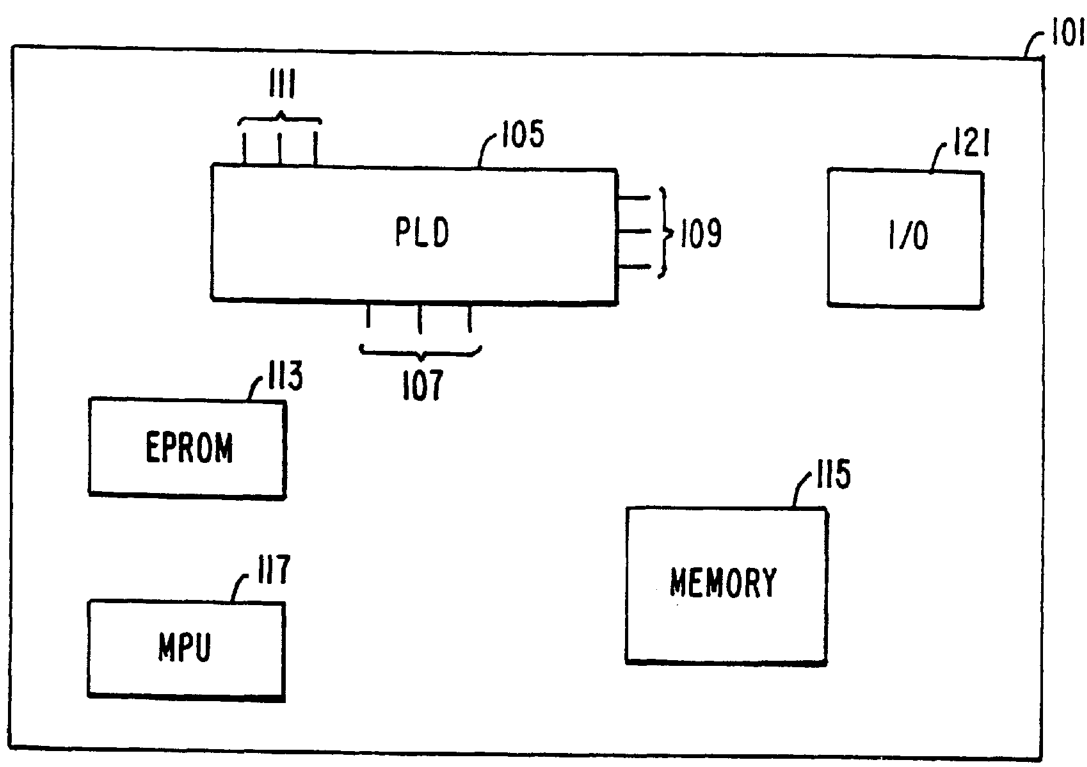
FIG. 1 is an illustration of a system in which the present invention will find application.

Logic devices and their operation are well known to those of skill in the art. FIG. 1 illustrates a system 101 in which a programmable logic device 105, made according to the invention described herein, may be incorporated. Programmable logic device 105 may be used to perform various logic functions in system 101. Programmable logic devices (sometimes referred to as a PALs, PLAs, FPLAs, PLDs, CPLDs, EPLDs, EEPLDs, LCAs, or FPGAs), are well-known integrated circuits that provide the advantages of fixed integrated circuits with the flexibility of custom integrated circuits. Such devices allow a user to electrically program standard, off-the-shelf devices to meet a user's specific needs. See, for example, U.S. Pat. No. 4,617,479, incorporated herein by reference for all purposes. Such devices are currently represented by, for example, Altera's MAX series of PLDs and FLEX series of PLDs. The former are described in, for example, the Altera Data Book, July 1996, incorporated herein by reference for all purposes. The latter are described in, for example, U.S. Pat. Nos. 5,258,668, 5,260,610, 5,260,611 and 5,436,575, incorporated herein by reference or all purposes.

Programmable logic devices may be used in systems 101 in a wide variety of applications such as, merely by way of example, telecommunications systems, switches, networks, automotive systems, control systems, consumer electronics, personal computers, and others. Systems 101 may be provided on a single board, on multiple boards, or even within multiple enclosures. Programmable logic device 105 may be provided with various inputs on pins 107 from system 101, and provide system 101 with various outputs on pins 109. Pins 107 and 109, in some cases, are programmable as input, output, or input/output pins and are, therefore, interchangeable. Other pins 111 may also be connected to the system and include, for example, control pins, and power supply pins.

System 101 may also include other integrated circuits, for example, special purpose integrated circuits, EPROM(s) 113 for programming the PLD, other memory devices 115, microprocessor(s) 117, input/output devices 121, and other integrated circuits of the type known to those of skill in the art.

Figure 2:
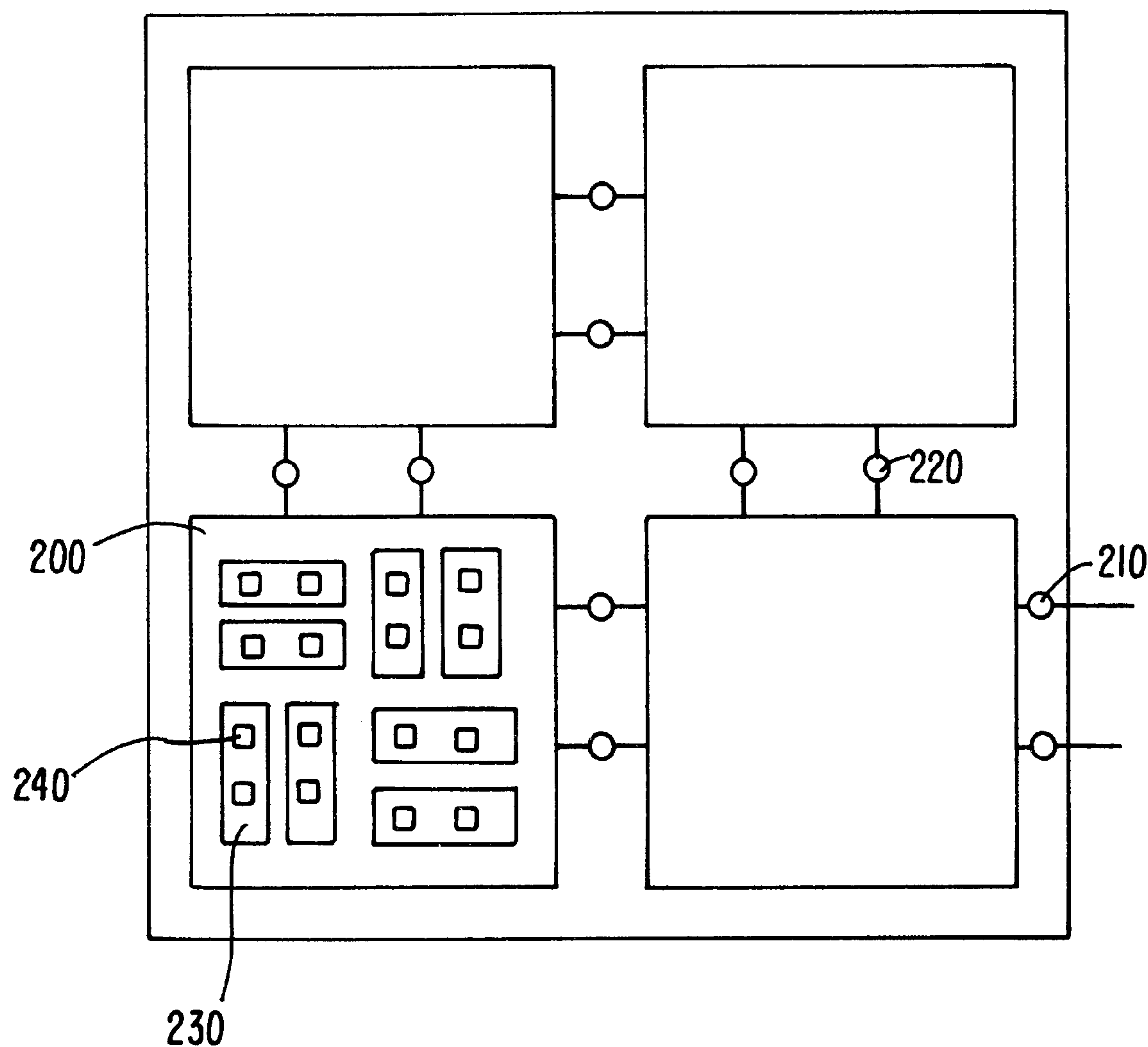
FIG. 2 is a block diagram of a programmable logic device according to one aspect of the invention.

FIG. 2 is an overall block diagram illustrating an embodiment of a programmable logic device 105 of the present invention. One or more routing networks 200 are coupled with input/output pins 210 and possibly with other routing networks 200 by interconnection circuitry 220. Each routing network 200 may comprise a plurality of logic elements 240. Logic elements 240 may be grouped into logic array blocks 230. A logic array block 230 has a number of logic elements 240 and a local interconnection scheme (not shown). The local interconnection scheme provides routing of signals among logic elements 240, within a common logic array block.

Logic elements 240 provide routing functions and perform logic functions for the programmable logic device. Each logic element 240 may be capable of performing combinational logic functions on its inputs. For example, logic element 240 may provide a desired output for each combination of, for example, four inputs. According to one aspect of the invention, logic elements 240 are formed as look-up tables. They may also include a storage device such as a flip-flop to allow for synchronous operation. Logic elements 240 may be combined in groups to form logic array blocks 230. In this particular example, each logic array block 230 has two logic elements 240 for clarity in the figure. In a preferred embodiment, each logic array block 230 may have eight logic elements 240. However, any number of logic elements 240 may be used.

The various logic elements within a routing network 200 may be interconnected in a particular manner which provides a network known in the industry as a Clos network. More detail regarding the interconnection of the logic elements will be found in the following specification.

Figure 3A:
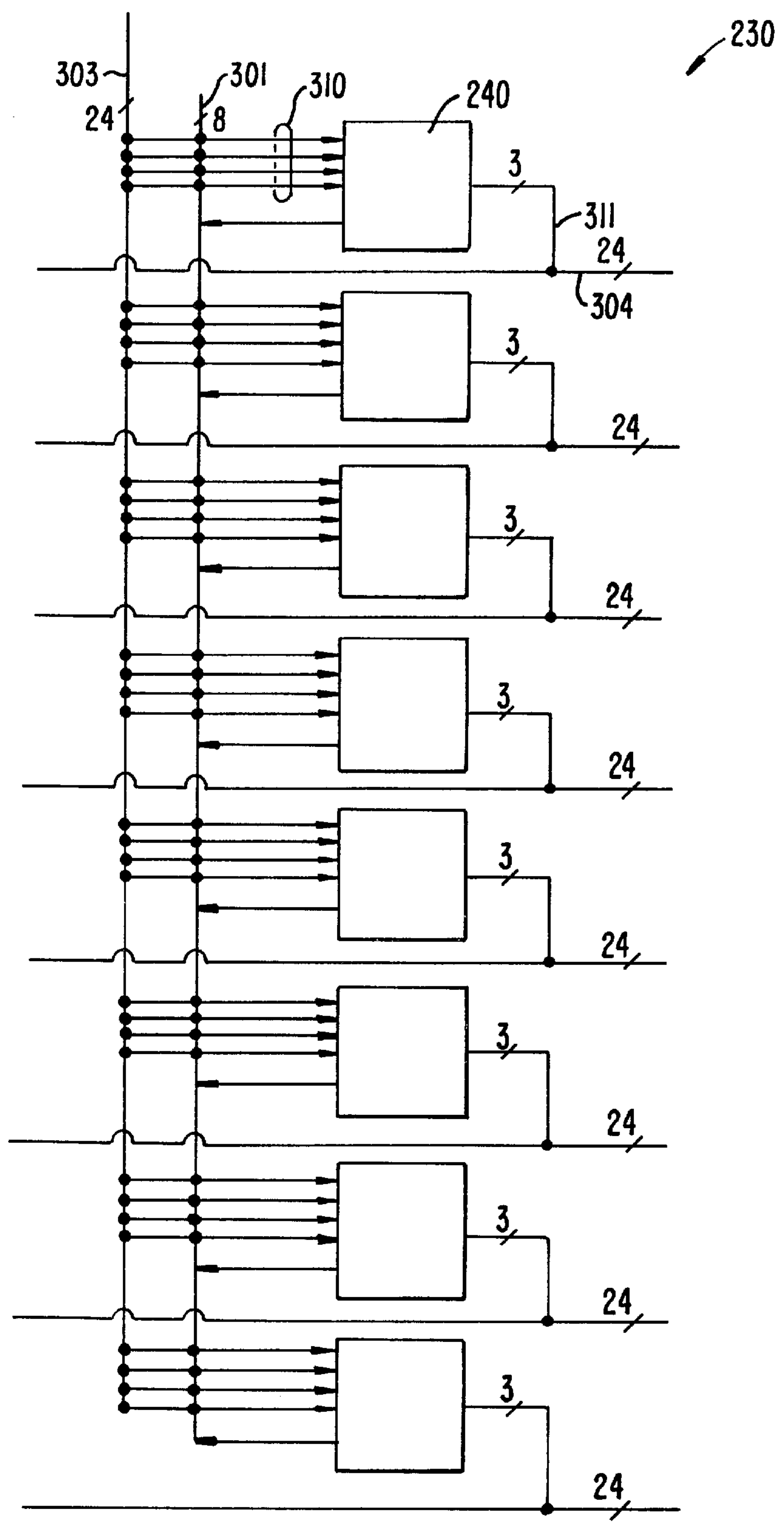
FIG. 3*a* is an illustration of a logic array block of the present invention.

FIG. 3*a* illustrates a more detailed block diagram of an embodiment of a logic array block 230 of the present invention. Eight representative logic elements 240 are shown. Details of logic elements 240 will be discussed with reference to FIG. 3*b* below. A local interconnection 301 is provided. Local interconnection 301 provides a path from the outputs of individual logic elements 240 to the inputs of other logic elements 240 within the same logic array block 230.

Also provided is an input bus and an output bus for logic array block 230. The input bus is a set of column inputs 303 and the output bus is a set of row outputs 304. For simplicity of explanation, these are referred to herein as column inputs 303 and row outputs 304. However, no positional or orientational meaning should be implied by the use of the terms "column" and "row." The references to rows and columns may be freely interchanged. They may be oriented horizontally, vertically, or otherwise. For example, by rotating a logic array block 90 degrees, rows may become columns and vice versa. This feature of the present invention provides a general, regular architecture allowing easy implementation of a logical structure. As will be discussed, in the preferred embodiment, adjacent routing networks 200 are oriented such that they are rotated 90 degrees with respect to each other. As such, the rows in one routing network 200 may be horizontally oriented, while the rows in an adjacent network 200 may be vertical. This is shown, for example, in FIG. 5 and discussed below. However, in other embodiments, logic elements need not be phisically oriented in any particular manner.

Each logic element has a number of logic element inputs 310. For example, FIG. 3*a* shows four logic element inputs 310, although any number may be provided. Each logic element also provides a number of logic element outputs 311. In a preferred embodiment, there are three logic element outputs. Again however, any number of logic element outputs 311 may be provided. The logic element inputs 310 may be coupled to column input 303, or to local interconnect 301. Column inputs 303 provide connections outside of logic array block 230. In an embodiment of the present invention, each logic array block has, for example, 24 lines in column input 303 and eight lines in local interconnect 301. Each of the four logic element inputs have a connection to each of the 24 lines in column input 303 and the eight lines in local interconnect 301. Alternatively, each logic element input may have a connection to a subset of lines in column inputs 303 and local interconnect 301.

The outputs 311 of logic elements 240 are also connected to sets of row outputs 304. Each logic element 240 of a particular logic array block 230 is connected with a different set of row outputs 304. Logic element output 311 of a given logic element 240 will provide a subset of the lines for a given set of row outputs 304. For example, if each logic array block 230 contains m logic elements 240 and each logic element 240 has n logic element outputs 311, the number of output lines in each set of row outputs 304 will be given by the equation $(m*n)$. This number may be equivalent to the number of column inputs 303. In this example, since there are eight logic elements 240 and three outputs 311 for each logic element 230, there are 24 output lines in each set of row outputs 304. As will be described in greater detail below, row outputs 304 of a group of logic array blocks may be coupled to the column inputs 303 of another group of logic array blocks 240. In the specific embodiment, row output 304 of one group of logic array blocks 230 is directly connected to column inputs 303 of the other group of logic array blocks 230.

Figure 3B:
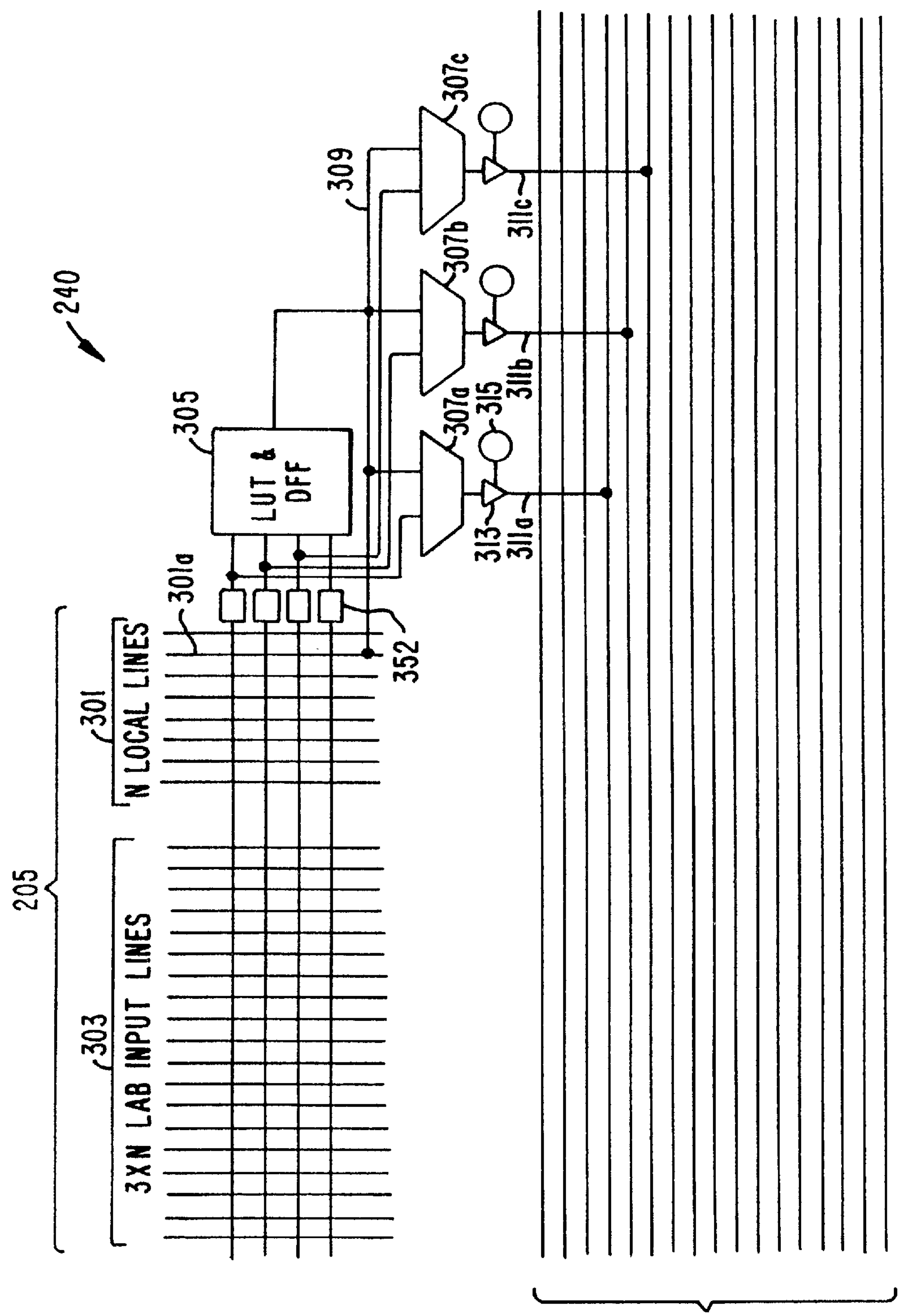
FIG. 3*b* illustrates a logic element that may be used in a LAB according to one embodiment of the invention.

FIG. 3*b* schematically illustrates a logic element 240 in greater detail according to one embodiment of the present invention. Not all lines in the logic element 240 are shown, nor are all functional circuits. Some elements have been eliminated for the sake of clarity.

Logic element 240 may include a logic function block 305. Logic function block 305 provides a result 309 based upon its inputs. Logic function block may include, for example, a look-up table or universal logic block. A storage element such as a flip-flop type device may also be included in logic function block 305. Each look-up table may be a circuit which can be programmed to produce a result 309 which is any logical function of the input signals applied to the look-up table. In this case, the look-up table has four inputs and one output. Each flip-flop may be a storage device which can be programmed either to store or to simply pass through the output signal of the associated look-up-table (see, for example, the circuit shown in Norman et al., U.S. Pat. No. 4,864,161, incorporated herein by reference.) Alternatively, the flip-flop could be a flip-flop with no pass through or bypass capability.

The inputs to the look-up table are provided from column inputs 303 and local interconnect 301. Column inputs 303 may be input interconnections which connect to other areas of a device containing logic element 240. These lines may be selectively coupled to the look-up table inputs via a programmably controlled programmable logic connector ("PLC") 352. PLC 352 may be implemented in any of a wide variety of ways. For example, each PLC 352 may be a relatively simple programmable connector such as a plurality of switches for connecting any one of several inputs to an output. Alternatively, each PLC 352 may be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs 352 are EPROMs, EEPROMs, pass transistors, transmission gates, antifuses, laser fuses, metal optional links, just to name a few.

Each of the four data inputs to each look-up table may be connected to any one (or more) of column inputs 303 (and/or) any one (or more) of the lines in local interconnect 301 via PLC 352. In the depicted, presently preferred embodiment, each PLCs 352 is a 32-to-1 switch so that any one of the 24 column inputs 303 or any one of the eight lines of local interconnect 301 can be connected to each look-up table input.

Result 309 of logic function block 305 in each logic element 240 can be applied to a respective one or more of the lines of local interconnect lines 301. In a preferred embodiment, local interconnect 301 serves only the logic modules in the associated logic array block 230. In other words, conductors in local interconnect 301 do not extend beyond the associated logic array block 230. However, in other embodiments this is not a necessary restriction.

Result 309 of logic function block 305 is also provided as an input to a number of multiplexers 307. In this example, three multiplexers 307*a*, 307*b*, and 307*c* are provided. A second input to each of the multiplexers 307*a*, 307*b*, and 307*c* is coupled to the outputs of the PLCs 352. In this example, a first PLC 352 output is provided to multiplexer 307*a*, a second to multiplexer 307*b*, and a third to multiplexer 307*c*.

Through this arrangement, it is possible to allow the result of the logic function block, or up to any three signals from the column inputs 303 and local interconnect 301 to drive any of the logic element output lines 311*a*, 311*b*, and 311*c*. Tri-state drivers 313 may optionally be provided to drive long output lines, and may be controllable a via function control element 315 (such as an SRAM memory cell.) The capability of logic element 240 to route signals from the column inputs to the logic element outputs, or to perform logic functions on the signals before providing the results to the logic element outputs allows greatly expanded versatility in the programmable logic device. For example, the logic element may now perform logic functions, routing functions, or even both simultaneously.

Figure 4:
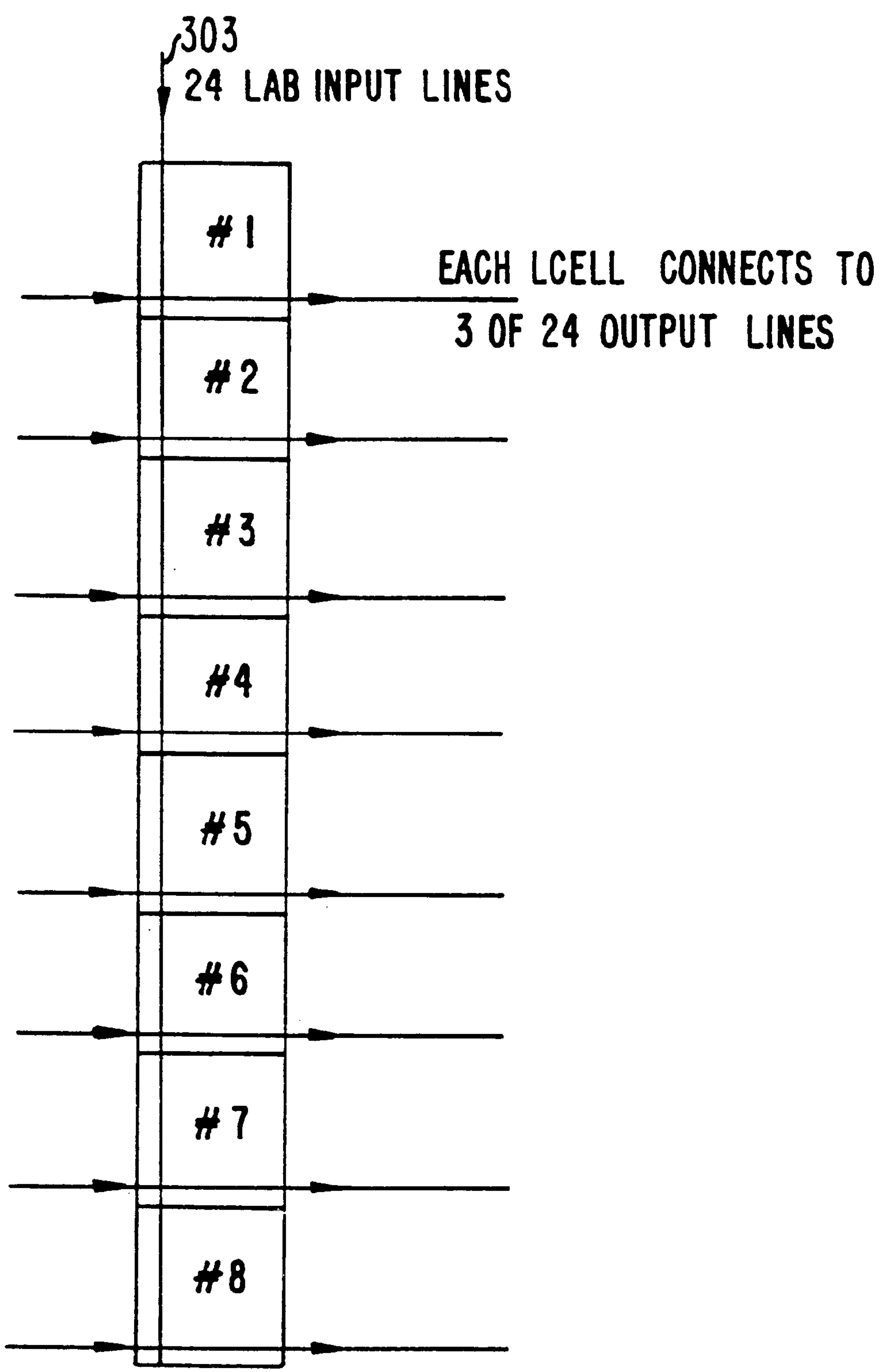
FIG. 4 illustrates the floor plan of a LAB showing the possible inputs and outputs to the LAB according to one aspect of the invention.

FIG. 4 conceptually illustrates the operation of logic array block 230 in greater detail. In this particular embodiment, each of the eight logic elements 240 in a logic array block 230 are provided with the capability of performing signal routing. Fewer logic elements 240 may be provided with this capability in some embodiments. As shown, the 24 column inputs 303 and the eight lines of local interconnect 301 are connected to each of the logic elements 240, and the logic element outputs are connected to three of the 24 output lines associated with each logic element. As can be seen, the combined routing and logic capability of the device greatly enhances the versatility of the device since the logic elements may be used not only for logic, but also for routing.

Figure 5:
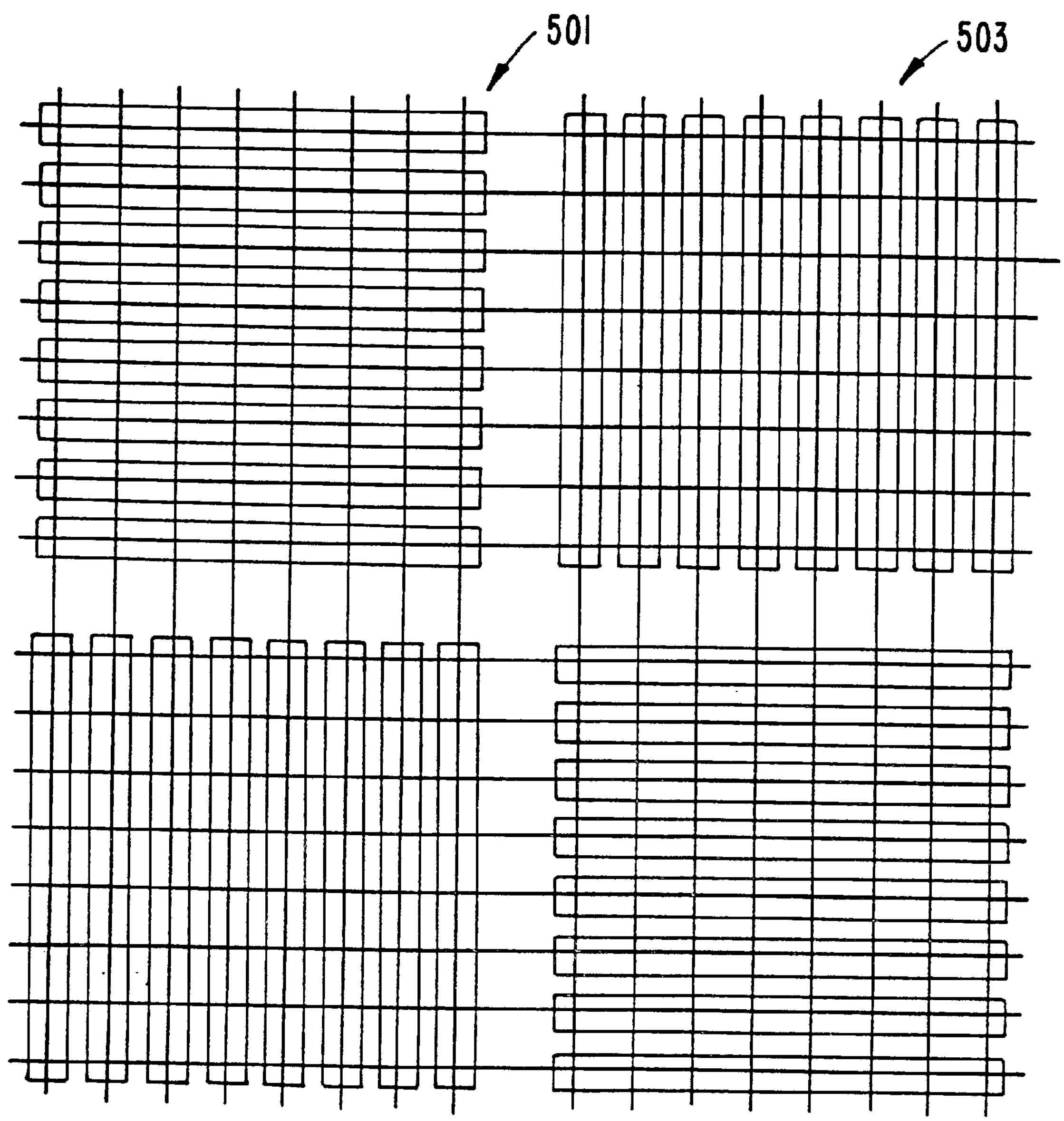
FIG. 5 illustrates a 256 logic cell device.

FIG. 5 illustrates the overall floorplan of a routing network of the present invention with 32 logic array blocks and 256 logic elements. The routing network may be designed with four quadrants. Each quadrant contains eight logic array blocks 230 of the configuration shown in FIG. 4. The logic array blocks may be placed side by side, conceptually. The three outputs of a given logic element 230 are connected to three of the 24 row outputs for the set of row outputs associated with the given logic element 230. Therefore, with eight logic array blocks, all of the 24 row outputs are connected to a logic element.

The above description is a specific embodiment of the invention and is shown by way of example only. Larger or smaller embodiments may be implemented with a different number of logic elements. Furthermore, there is no need that there be four quadrants, but any number of groups of logic array blocks may be used.

As shown in FIG. 5, the logic array blocks of adjacent quadrants are arranged in a vertical/horizontal orientation. For example, the logic array blocks of quadrant 501 of the device are arranged to run horizontally across the page of FIG. 5, while the logic array blocks in quadrant 503 are arranged to run vertically on the page (i.e., the logic elements are arranged in columns in region 503 that are orthogonal to the columns of logic elements in region 501.) With this arrangement, the output lines of one quadrant of logic array blocks feed the inputs to the logic array blocks of the adjacent quadrant.

Figure 6:
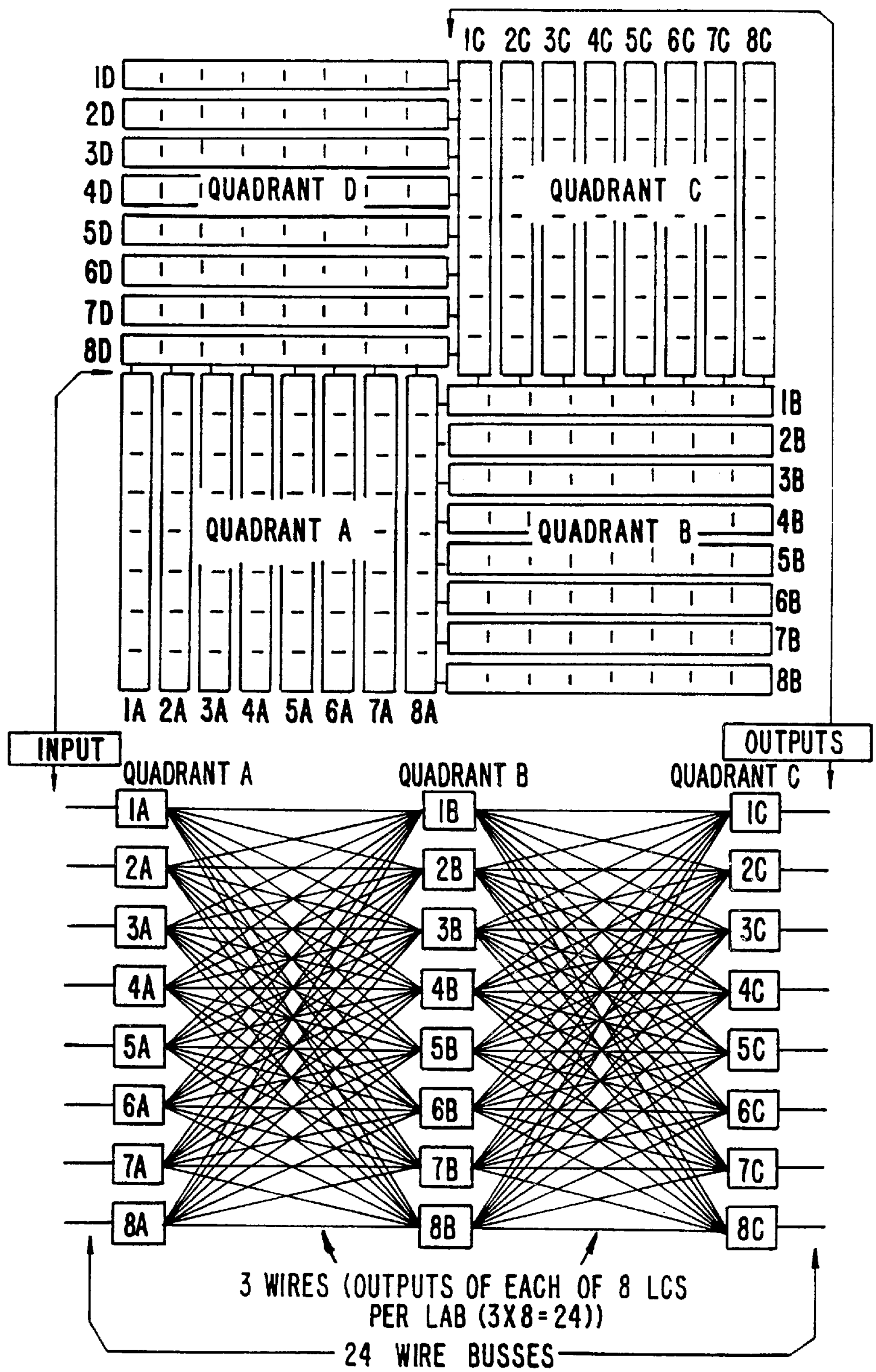
FIG. 6 illustrates the correspondence of the present invention to a Clos routing network.

FIG. 6 illustrates certain advantages of the invention. In particular, the top portion of the figure is another way of depicting the arrangement of FIG. 5. Each column of logic elements is grouped as a logic array block and represented by the labels 1A, 2A, 1B, etc.

The bottom portion of FIG. 6 illustrates the connectability of quadrants A, B, and C, as illustrated in the top portion of FIG. 6. As shown, a signal on any of the column inputs to logic array block 1A is connectable to any of the logic array blocks of quadrant B. This may be done by routing the signal through the logic element in column 1A that is located on the row of the column in quadrant B that is the intended destination. Similarly, the outputs of logic array block 2A may be connected to any of the logic array blocks in quadrant B. Accordingly, it is seen that a high degree of connectability is achieved with minimal routing delay.

In particular, with three groups of logic elements connected in the arrangement shown in FIG. 6, a network is formed that is known in the art as a Clos network. An advantage of a Clos network is that it is non-blocking. In particular, in the example shown, all of the 8×24 inputs to quadrant A can be connected to the 8×24 outputs of quadrant C without blocking for every possible set of one to one mappings. Other types of networks that are substantially similar to a Clos network may also be achieved with slight modifications to this design.

Figure 7:
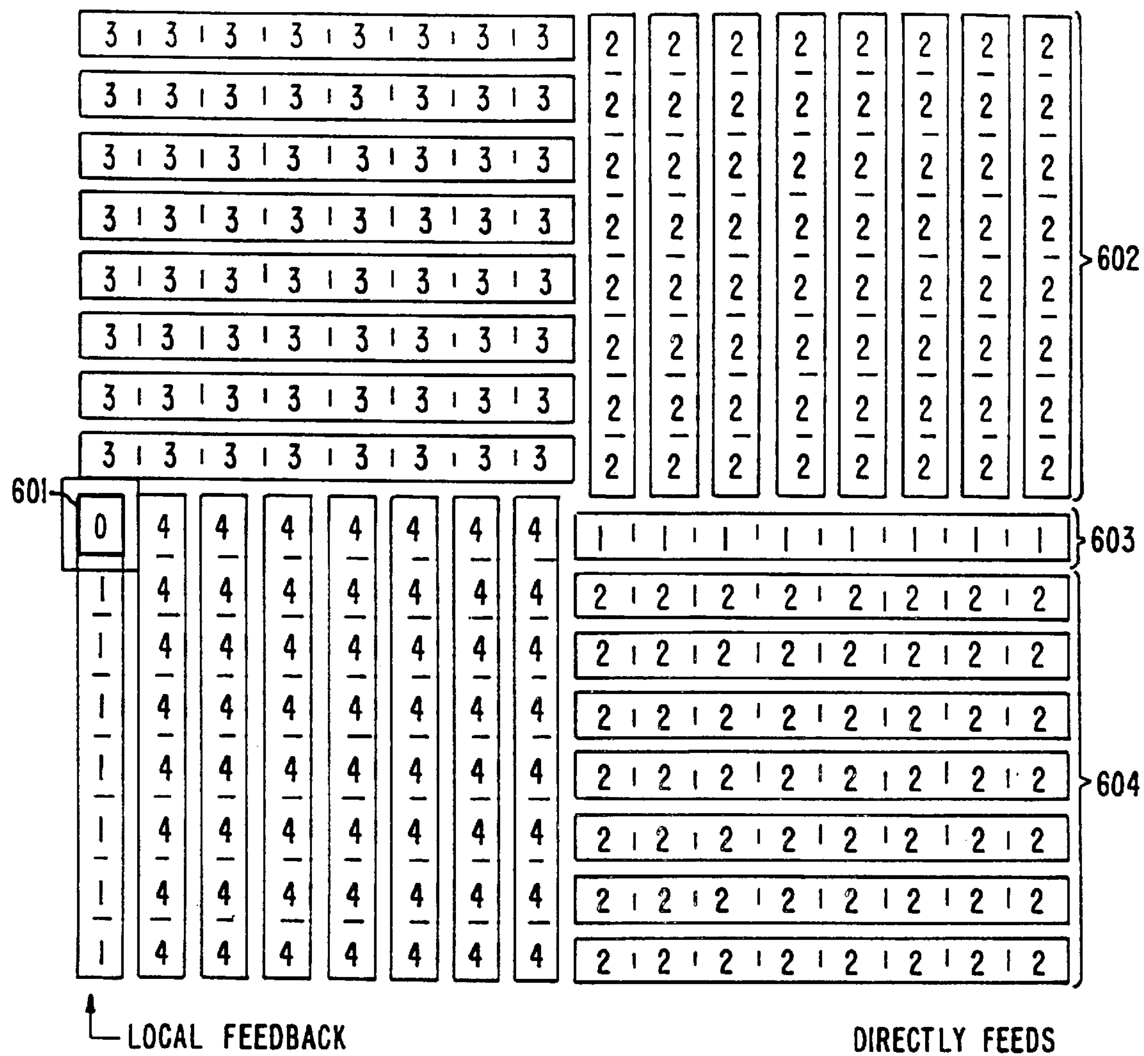
FIG. 7 illustrates the number of delays needed to route to all other logic elements according to one embodiment of the present invention.

FIG. 7 illustrates how a routing network such as that disclosed in the present invention impacts routing delays between logic elements in a typical programmable logic device. The example shown is the 256 logic element configuration of FIG. 5. A logic element 601 is used as a particular example. The remaining logic elements are labeled with a number showing the number of routing delays (i.e., number of gate delays) between logic element 601 and the other logic elements in the routing network. This particular example assumes that it is desirable that an output of logic element 601 feeds an input of each of the remaining 255 logic elements in the routing network.

For each logic element in the same logic array block as logic element 601, there is a single gate delay in a signal transmission from the logic element input from the output of logic element 601. This is the delay from PLC 352 shown in FIG. 3. Similarly, the logic elements in the column 603, which are horizontally aligned with logic element 601 will suffer only a single gate delay from PLC 352 of the corresponding logic element. Logic elements in region 602 will suffer two gate delays since one of the logic elements in the region 603 will be used to route the signal into region 602. Region 604 also suffers two delays since the other logic elements in the logic array block with logic element 601 will route the signal from the wire driven by logic element 601 to another logic element which will route the signal to the logic elements of region 602. Three gate delays will be experienced as a signal goes from logic element 601 to logic elements in the upper left quadrant of the routing network and four gate delays will be experience in reaching the remaining logic elements in the same quadrant as logic element 601.

Of course, it will be recognized that modifications to the signal path, such as the addition of other elements or the removal of elements may cause these delays to be different. Such changes do not detract from the spirit of the present invention.

FIG. 8*a* illustrates a typical embodiment of a programmable logic device of the present invention with a larger number of logic elements (1024 in this case). This arrangement comprises four of the routing networks described above. The routing networks are arranged in a 2×2 array. As shown, inputs and outputs are stitched together such that each of the four routing networks may communicate with each other. In this case, tri-state drivers 801 are used to connect each of the lines together and may each be set to drive in either direction or to not drive at all. FIG. 8*b* illustrates the circuits 801 in greater detail. Also shown in FIG. 8*a* is a typical I/O block 803, which is shown in greater detail in FIG. 8*c*.

The above description is illustrative and not restrictive. Many variations of the invention will become apparent to those of skill in the art upon review of this disclosure. Merely by way of example, the invention has been illustrated primarily with regard to devices using SRAM look-up tables to perform combinational logic functions and specific numbers of logic elements and logic array block. However, the invention is not so limited. The scope of the invention should, therefore, be determined not with reference to the above description, but instead should be determined with reference to the appended claims along with their full scope of equivalents.

What is claimed is:

1. A programmable integrated circuit comprising:

a logic element comprising an input, an output, and a logic function block, said input selectively coupled to pass an input signal through said logic function block and provide a result to said output based on said input signal, and said input being selectively coupled to pass said input signal unstored to said output bypassing said logic function block to provide the input signal to said output.

2. The programmable integrated circuit of claim 1 wherein said logic function block includes a look-up table, whereby said result is provided from said look-up table based on said input.

3. The programmable integrated circuit of claim 2 wherein said look-up table is implemented using SRAM technology.

4. The programmable integrated circuit of claim 1 wherein said logic function block includes a storage device.

5. The programmable integrated circuit of claim 4 wherein said storage device is a flip-flop.

6. The programmable integrated circuit of claim 1 further comprising:

a plurality of input interconnections; and a programmable logic connector, said programmable logic connector selectively coupling said plurality of input interconnections to said logic function block and said output.

7. The programmable integrated circuit of claim 1 wherein said result is selectively coupled to said logic function block through said input.

8. The programmable integrated circuit of claim 1 further comprising a multiplexer, said multiplexer selectively connecting either said input signal or said result to said output.

9. A system comprising a programmable integrated circuit as recited in claim 8 and a memory for loading configuration information into said programmable integrated circuit.

10. A system comprising a programmable integrated circuit as recited in claim 1, said system comprising circuits for providing inputs to said programmable logic circuit and circuits responsive to outputs from said programmable logic circuit.

11. A programmable integrated circuit comprising:

a plurality of output interconnections;

a logic element comprising:

an input; and a programmable function block selectively enabled to perform a logical operation based on said input and provide a result on one of said plurality of output interconnections; and a multiplexer selectively enabled to pass an input signal on said input to one of said plurality of output interconnections bypassing said programmable function block and without storing said input signal.

12. The programmable integrated circuit of claim 11 further comprising:

a plurality of input interconnections; and a programmable logic connector; said programmable logic connector selectively coupling one of said input interconnections to said input.

13. The programmable integrated circuit of claim 1 wherein said programmable function block includes a look-up table for providing a result based on said input.

14. The programmable integrated circuit of claim 13 wherein said look-up table is implemented using static memory.

15. The programmable integrated circuit of claim 11 wherein said programmable function block includes a storage device.

16. The programmable integrated circuit of claim 15 wherein the storage device is a flip-flop.

17. A system comprising a programmable integrated circuit as described in claim 11.

18. A system comprising a logic device as recited in claim 17.

19. The programmable integrated circuit of claim 11 wherein the multiplexer may pass the input signal to only one output interconnection of said plurality of output interconnections.

20. The programmable integrated circuit of claim 11 further comprising a plurality of input interconnections coupled to the input of said logic element, each of said input interconnections providing a separate input signal to said input.

21. The programmable integrated circuit of claim 20 further comprising a plurality of multiplexers, each of said plurality of multiplexers selectively enabled to pass one of the input signals from said plurality of input interconnections to one of said plurality of output interconnections bypassing said programmable function block and without storing said input signal.

22. The programmable integrated circuit of claim 21 wherein each of said plurality of multiplexers is coupled to a different one of said output interconnections.

23. A programmable integrated circuit comprising:

an input;

an output;

a programmable function block selectively enabled to perform a logical operation based on said input and provide a result;

a storage device coupled to store the result of said programmable function block and provide a stored result; and a multiplexer selectively enabled to pass an input signal on said input to said output bypassing said programmable function block and said storage device.

24. The programmable integrated circuit of claim 23 wherein the multiplexer is selectively enabled to pass the result of said programmable function block to said output.

25. The programmable integrated circuit of claim 23 wherein the multiplexer is selectively enabled to pass the stored result to said output.

* * * * *

UNITED STATES PATENT AND TRADEMARK OFFICE

CERTIFICATE OF CORRECTION

PATENT NO. : 6,414,514 B1
DATED : July 2, 2002
INVENTOR(S) : Heile

It is certified that error appears in the above-identified patent and that said Letters Patent is hereby corrected as shown below:

Column 9,
Line 1, please replace "claim 1" with -- claim 11 --.

Signed and Sealed this

Eleventh Day of February, 2003

JAMES E. ROGAN
*Director of the United States Patent and Trademark Office*